(12) United States Patent
Arya et al.

(10) Patent No.: US 7,352,535 B2
(45) Date of Patent: Apr. 1, 2008

(54) METHOD AND APPARATUS FOR REDUCING CROSSTALK AND SIGNAL LOSS IN FLEXING INTERCONNECTS OF AN ELECTRICAL LEAD SUSPENSION

(75) Inventors: Satya Prakash Arya, San Jose, CA (US); John Thomas Contreras, Palo Alto, CA (US); Klaas Berend Klaassen, Santa Jose, CA (US); Nobumasa Nishiyama, Yokohama (JP)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 480 days.

(21) Appl. No.: 11/035,429

(22) Filed: Jan. 13, 2005

(65) Prior Publication Data

US 2006/0152854 A1    Jul. 13, 2006

(51) Int. Cl.
*G11B 5/54* (2006.01)
(52) U.S. Cl. .................................. 360/245.9
(58) Field of Classification Search ............ 360/245.9, 360/246, 264.2, 254.9
See application file for complete search history.

(56) References Cited

U.S. PATENT DOCUMENTS

| | | | |
|---|---|---|---|
| 5,687,479 A | 11/1997 | Bennin et al. | |
| 5,699,212 A | 12/1997 | Erpelding et al. | |
| 5,805,382 A | 9/1998 | Lee et al. | |
| 5,933,293 A * | 8/1999 | Bennin | 360/245.9 |
| 6,125,015 A | 9/2000 | Carlson et al. | |
| 6,249,404 B1 | 6/2001 | Doundakov et al. | |
| 6,278,585 B1 * | 8/2001 | Olson et al. | 360/264.2 |
| 6,282,064 B1 | 8/2001 | Palmer et al. | |
| 6,493,190 B1 * | 12/2002 | Coon | 360/245.9 |
| 6,762,913 B1 * | 7/2004 | Even et al. | 360/246 |
| 6,785,094 B2 * | 8/2004 | Arya et al. | 360/244.3 |
| 6,801,402 B1 * | 10/2004 | Subrahmanyam et al. | 360/245.9 |
| 2002/0181156 A1 * | 12/2002 | Shiraishi et al. | 360/245.9 |
| 2004/0066585 A1 | 4/2004 | Shum | |
| 2004/0070884 A1 | 4/2004 | Someya et al. | |

FOREIGN PATENT DOCUMENTS

| | | |
|---|---|---|
| JP | 2000-231710 | 8/2000 |
| JP | 2002-170215 | 6/2002 |
| JP | 2003-272119 | 9/2003 |

\* cited by examiner

*Primary Examiner*—Tianjie Chen
(74) *Attorney, Agent, or Firm*—Duke Amaniampong

(57) ABSTRACT

A method and apparatus for reducing crosstalk and signal loss in an electrical interconnect is disclosed. The electrical interconnect includes a laminate. A plurality of signal traces and a subsequent plurality of traces are in a first formed layer of the laminate. The subsequent plurality of traces may be signal traces or power traces. The laminate has a dielectric layer between the first formed layer and a second formed layer. A plurality of serpentine patterns are in the second formed layer of the laminate. The plurality of serpentine patterns is separated from subsequent patterns. The plurality of serpentine patterns supports the plurality of signal traces and the subsequent plurality of patterns supports the subsequent plurality of traces. The supporting of the plurality of signal traces separate from the subsequent plurality of traces reduces write-to-read crosstalk and signal loss.

26 Claims, 11 Drawing Sheets

METHOD AND APPARATUS FOR REDUCING CROSSTALK AND SIGNAL LOSS IN FLEXING INTERCONNECTS OF AN ELECTRICAL LEAD SUSPENSION

TECHNICAL FIELD

Embodiments of the present invention relate to the field of electrical interconnect, and more particularly to an apparatus and method for reducing crosstalk and signal loss in flexing interconnects of an integrated lead suspension used in hard disk drives.

BACKGROUND ART

An electrical lead suspension (henceforth referred to as ELS), used in a Data Access Storage Device (DASD), e.g., a hard disk drive (HDD), comprises flexing interconnect that is typically formed of a laminate comprised of at least three layers of material. These laminate layers may include a signal-conductor layer from which signal traces are formed, a dielectric layer, e.g., polyimide, for insulation and support for the signal-conductor layer, and a conductive base-metal layer to provide support for the dielectric layer. The flexing interconnect spans a hinge area of the ELS where a load beam attaches to a mount plate. An ELS may be formed by a subtractive process, such as, e.g. an Integrated Lead Suspension (ILS), an additive process, such as, e.g., a Circuit Integrated suspension (CIS) or as a Flex-On Suspension (FOS) when the FOS is attached to a base metal layer, or it may be a Flex Gimbal Suspension Assembly (FGSA) that is attached to a base metal layer, or any form of lead suspension used in a DASD.

Prior Art FIG. 1 is a top plan view 100 of a portion of a flexing interconnect having write traces 120 and read traces 130, formed of the signal-conductor layer of a laminate and supported by dielectric layer 140 and a single serpentine pattern 110, formed of the base-metal layer of the laminate, according to an embodiment of the conventional art. In order to provide flexibility in the hinge area of the laminate, the supporting base-metal layer is, according to conventional art, in the form of serpentine pattern 110. In other words, portions of the base-metal layer are removed so as to allow for flexibility in the hinge area to allow the head to fly properly, while providing a necessary amount of mechanical stiffness for supporting the signal traces 120 and 130 that are the read and write traces.

While the serpentine pattern 110 can provide the appropriate mechanical stiffness, the connecting serpentine pattern underneath the write and read traces 120 and 130 results in write-to-read crosstalk that degrades the performance of the read sensor. A large write driver voltage produces a large current in the write traces 120, in turn, write current induces currents in read traces 130 through serpentine base-metal layer 110 resulting in crosstalk between write and read traces. The read traces 130 connect to a very voltage-sensitive read sensor.

SUMMARY

Embodiments of the present invention include a method and apparatus for reducing crosstalk and signal loss in an electrical interconnect. The electrical interconnect includes a laminate. A plurality of signal traces and a subsequent plurality of traces are in a first formed layer of the laminate. The subsequent plurality of traces may be signal traces or power traces. The laminate has a dielectric layer between the first formed layer and a second formed layer. A plurality of serpentine patterns are in the second formed layer of the laminate. The plurality of serpentine patterns is separated from subsequent patterns. The plurality of serpentine patterns supports the plurality of signal traces and the subsequent plurality of patterns supports the subsequent plurality of traces. The supporting of the plurality of signal traces separate from the subsequent plurality of traces reduces write-to-read crosstalk and signal loss.

BRIEF DESCRIPTION OF THE DRAWINGS

Prior Art

DETAILED DESCRIPTION

Reference will now be made in detail to embodiments of the invention, examples of which are illustrated in the accompanying drawings. While the invention will be described in conjunction with the embodiments, it will be understood that they are not intended to limit the invention to these embodiments. Furthermore, in the following detailed description, numerous specific details are set forth in order to provide a thorough understanding of the present invention. In other instances, well known methods, procedures, and components have not been described in detail so as not to unnecessarily obscure aspects of the present invention.

Figure 7:
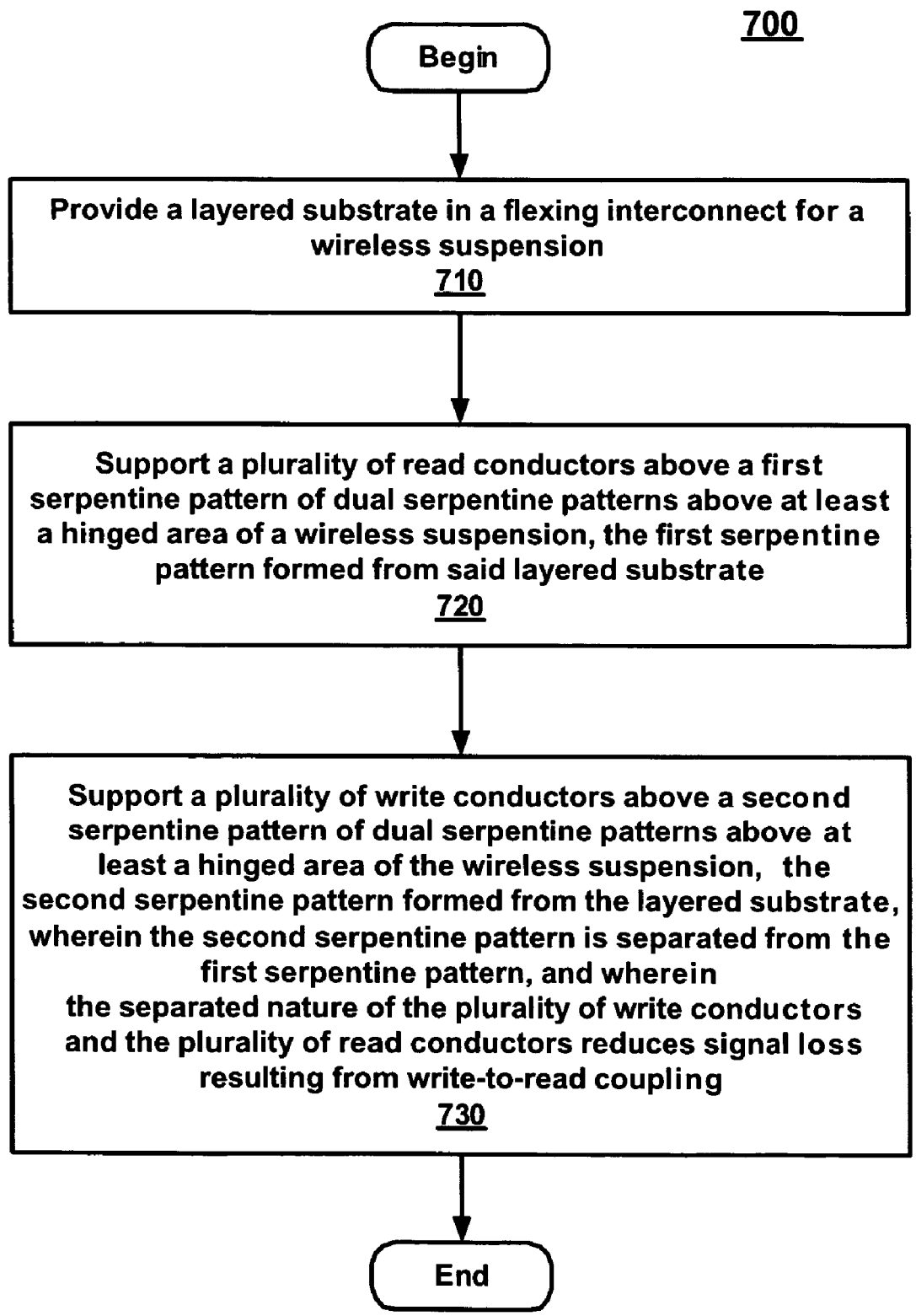
FIG. 7 is a flow diagram of a method for obtaining low crosstalk and signal loss in a flexing interconnect, in accordance with one embodiment of the present invention.

Certain portions of the detailed descriptions of embodiments of the invention, which follow, are presented in terms of processes and methods (e.g., method 700 of FIG. 7). Although specific steps are disclosed herein describing the operations of these processes and methods, such steps are exemplary. That is, embodiments of the present invention are well suited to performing various other steps or variations of the steps recited in the processes and methods herein.

Figure 1:
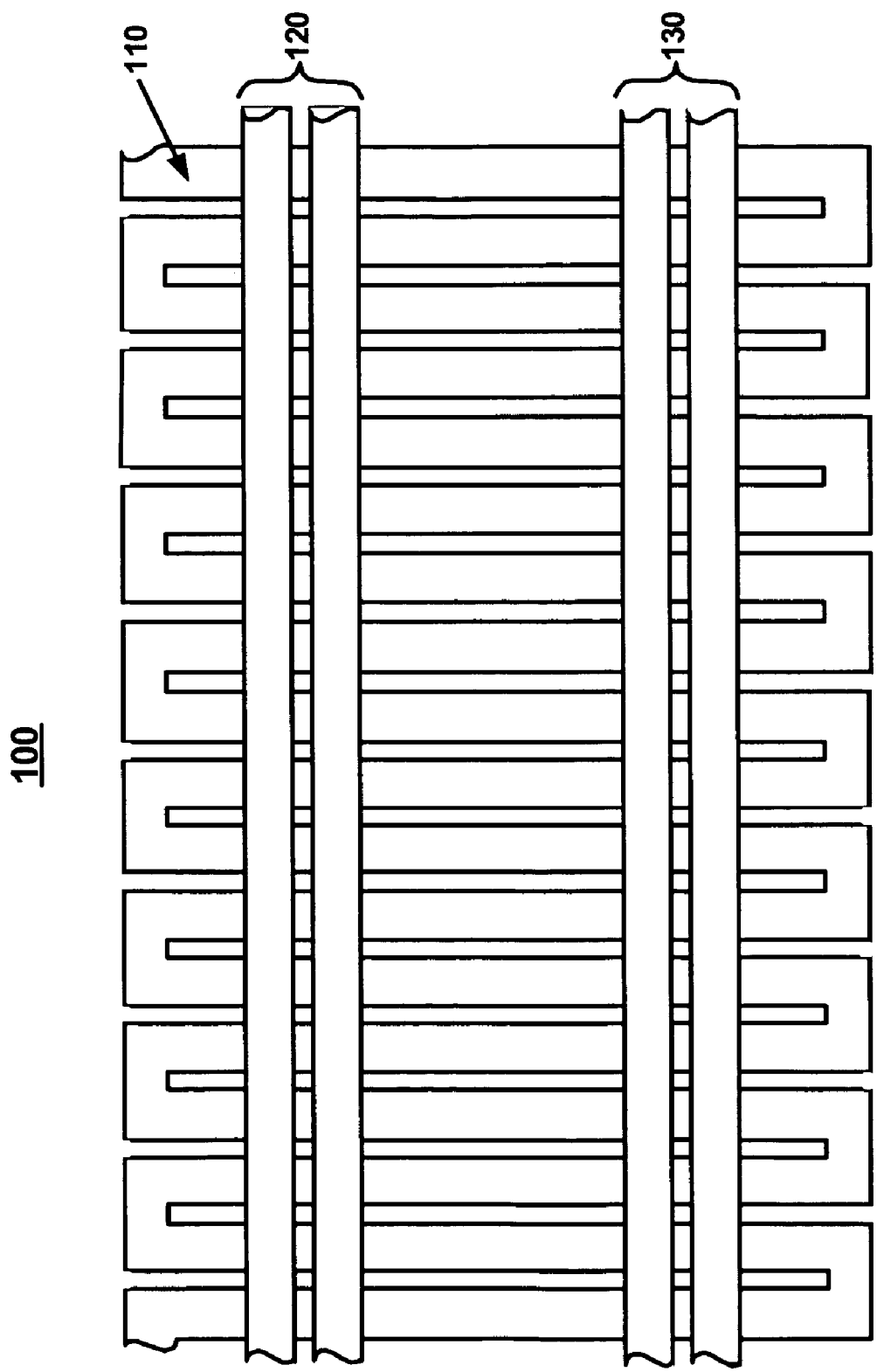
FIG. 1 is a top plan view of a portion of a flexing interconnect having read and write traces and a single serpentine pattern electrically separated by an dielectric layer, according to an embodiment of the conventional art.
Figure 2:
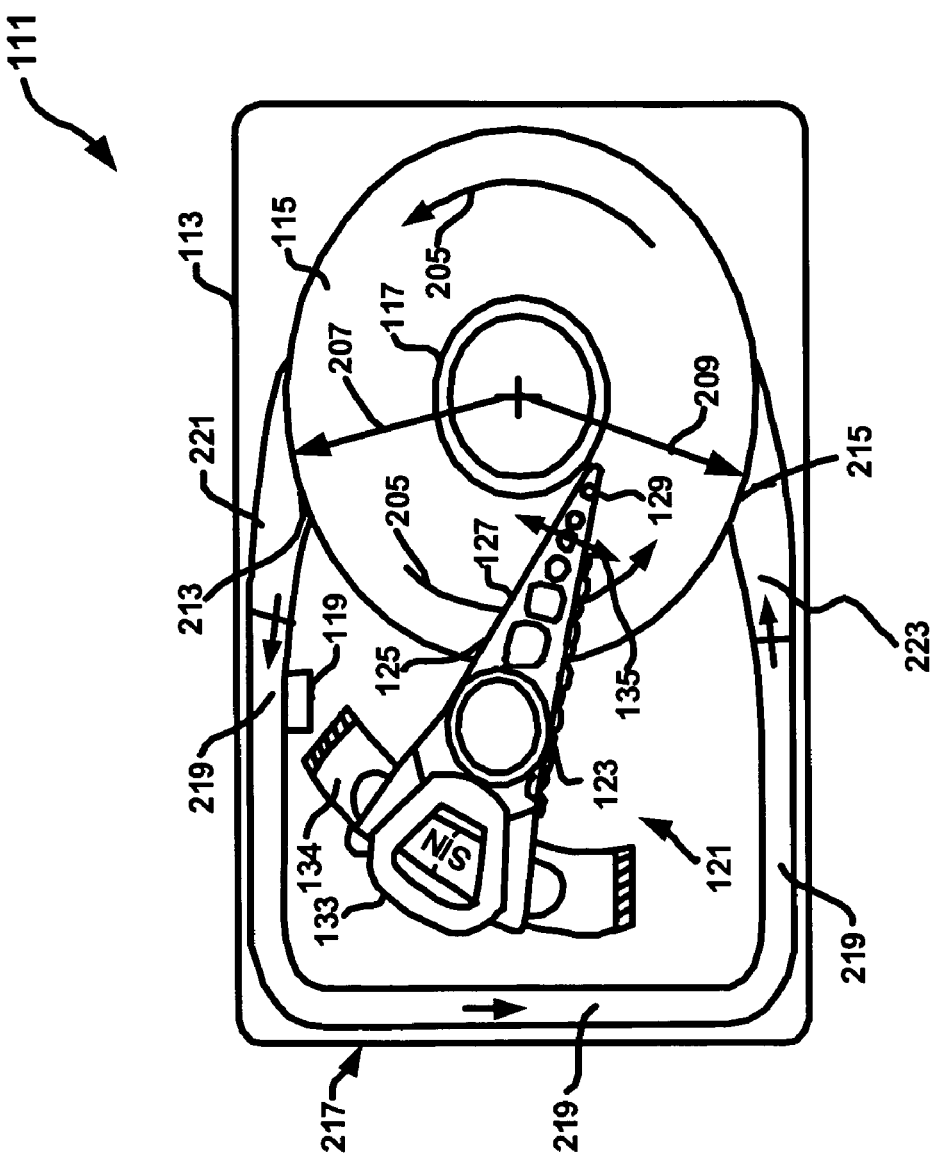
FIG. 2 is a schematic top plan view of a hard disk drive, in accordance with one embodiment of the present invention.

FIG. 2 is a schematic drawing of one embodiment of an information storage system comprising a magnetic hard disk file or drive 111 for a computer system is shown. Drive 111 has an outer housing or base 113 containing a disk pack having at least one media or magnetic disk 115. The disk or disks 115 are rotated by a spindle motor assembly having a central drive hub 117. An actuator 121 comprises a plurality of parallel actuator arms 125 (one shown) in the form of a comb that is movably or pivotally mounted to base 113 about a pivot assembly 123. A controller 119 is also mounted to base 113 for selectively moving the comb of arms 125 relative to disk 115.

In the embodiment shown, each arm 125 has extending from it at least one cantilevered load beam and electrical lead suspension (ELS) 127. It should be understood that ELS 127 may be, in one embodiment, an integrated lead suspension (ILS) that is formed by a subtractive process. In another embodiment, ELS 127 may be formed by an additive process, such as a Circuit Integrated Suspension (CIS). In yet another embodiment, ELS 127 may be a Flex-On Suspension (FOS) attached to base metal or it may be a Flex Gimbal Suspension Assembly (FGSA) that is attached to a base metal layer. The ELS may be any form of lead suspension that can be used in a Data Access Storage Device, such as a HDD. A magnetic read/write transducer or head is mounted on a slider 129 and secured to a flexure that is flexibly mounted to each ELS 127. The read/write heads magnetically read data from and/or magnetically write data to disk 115. The level of integration called the head gimbal assembly is the head and the slider 129, which are mounted on ELS 127. The slider 129 is usually bonded to the end of ELS 127.

ELS 127 has a spring-like quality, which biases or presses the air-bearing surface of the slider 129 against the disk 115 to cause the slider 129 to fly at a precise distance from the disk. ELS 127 has a hinge area that provides for the spring-like quality, and a flexing interconnect (or flexing interconnect) that supports read and write traces through the hinge area. A voice coil 133, free to move within a conventional voice coil motor magnet assembly 134 (top pole not shown), is also mounted to arms 125 opposite the head gimbal assemblies. Movement of the actuator 121 (indicated by arrow 135) by controller 119 causes the head gimbal assemblies to move along radial arcs across tracks on the disk 115 until the heads settle on their set target tracks. The head gimbal assemblies operate in a conventional manner and always move in unison with one another, unless drive 111 uses multiple independent actuators (not shown) wherein the arms can move independently of one another.

Although embodiments of the present invention are described in the context of an ELS in an information storage system, it should be understood that embodiments may apply to any device utilizing an electrical interconnect that might experience signal loss and crosstalk between signal traces. For example, embodiments of the present invention may apply to rigid printed circuit boards. More specifically, embodiments of the present invention may be used in printed circuit boards that are used for high speed signal processing. Embodiments of the present invention are also suitable for use in flexing circuits, e.g., flexing circuits for digital cameras and digital camcorders. The signal traces may also be replaced with power traces according to one embodiment.

Figure 3:
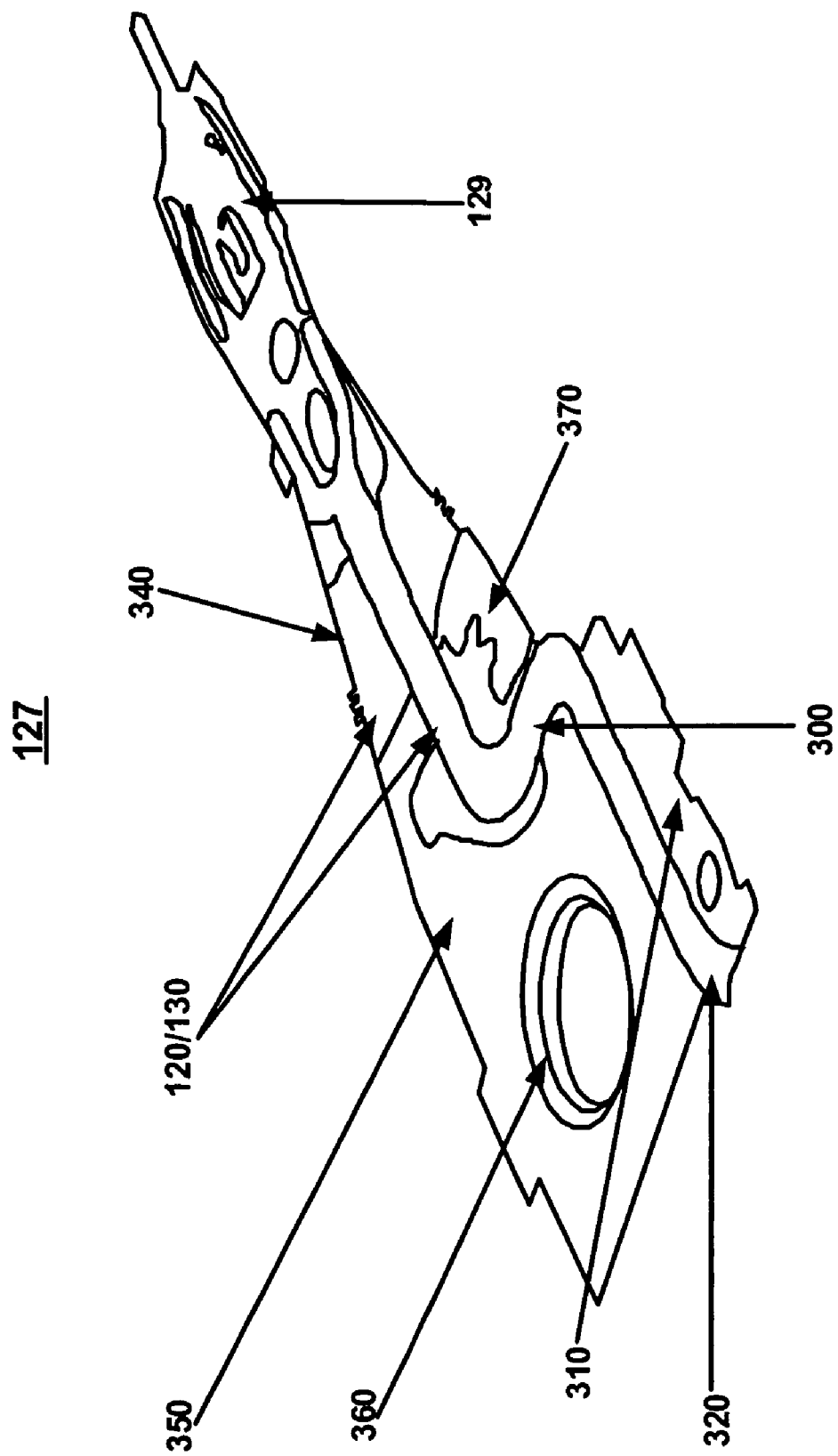
FIG. 3 is a top plan view of an ELS having a flexing interconnect, according to one embodiment of the present invention.

FIG. 3 is a top plan view of an ELS 127 having a flexing interconnect 300, according to one embodiment of the present invention. The read and write traces, 120 and 130, pass through the hinge center 370 of ELS 127, where loadbeam 340 connects, via hinge plate 350, to mount plate 360, according to one embodiment of the present invention. Slider 129 resides toward the end of ELS 127, and contains the read/write head. Slider 129 is bonded to read and write traces 120 and 130, where read and write signals are carried to and from the read/write head.

Flexing interconnect 300 of ELS 127 can be formed of a laminate that is, according to one embodiment, of at least three layers of materials. A signal-conductor layer may be a highly conductive metal, e.g., copper, from which the read and write traces 120 and 130 are formed. A middle layer 320 can be an insulating dielectric layer, e.g., polyimide, separating the top layer from which write and read traces 120 and 130 are formed of a base metal layer 310, such as stainless steel, from which serpentine patterns are formed.

Figure 4:
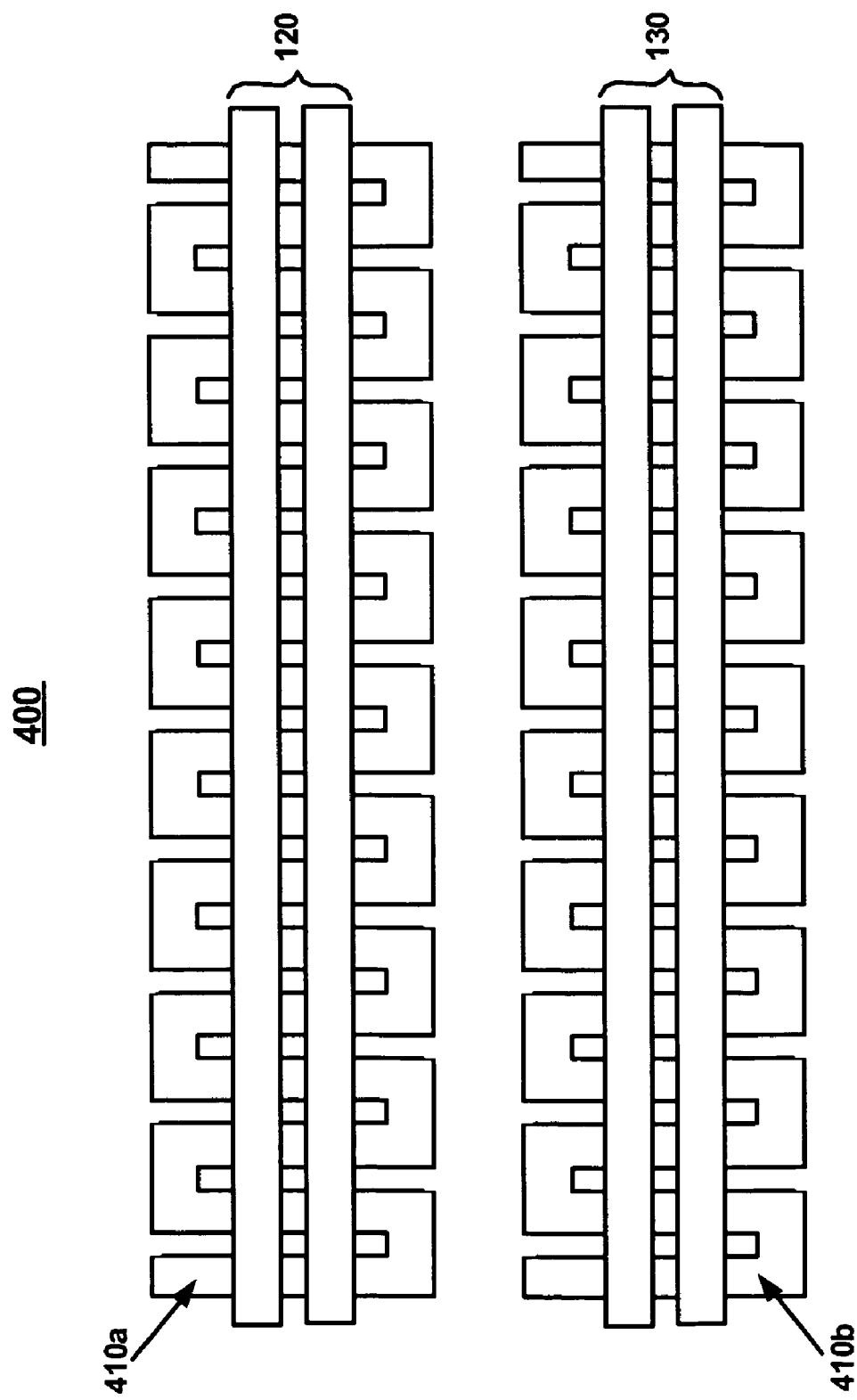
FIG. 4 is a top view of a portion of a flexing interconnect having read and write traces supported individually by a first serpentine pattern and a second serpentine pattern, respectively, of a dual serpentine pattern flexing interconnect support, in accordance with one embodiment of the present invention.

FIG. 4 is a top view of a portion 400 of a flexing interconnect, e.g. flexing interconnect 300 of FIG. 3, having write traces 120 and read traces 130 formed of the signal-conductor layer supported individually by dielectric layer 140, and then a first serpentine pattern 410a and a second serpentine pattern 410b, respectively, of a dual serpentine pattern of the flexing interconnect support formed of a base-metal layer, in accordance with one embodiment of the present invention.

The portion 400 of flexing interconnect of FIG. 4 comprises a laminate for supporting attached devices, according to one embodiment of the present invention. A plurality of read traces 130 are formed of the signal-conductor layer, according to one embodiment, as are a plurality of write traces 120. Dual serpentine patterns 40a and 410b are formed of a layer, e.g., base-metal layer 310 of FIG. 3, of the laminate. A first dual serpentine pattern 410a is separated from a second dual serpentine pattern 410b. The first dual serpentine pattern 410a supports the plurality of write traces 120 and the second dual serpentine pattern supports the plurality of read traces 130 above at least a hinge area, e.g., hinge area 370 of ELS 127. The dual serpentine pattern supporting the plurality of write traces 120 separate from the plurality of read traces 130 reduces write-to-read crosstalk and signal loss.

According to one embodiment, the layered laminate from which the flexing interconnect 300 is formed comprises at least a signal-conductor layer, e.g. copper alloy, a dielectric layer, e.g. polyimide, and a base-metal layer, e.g. stainless steel. The dielectric layer is sandwiched between the signal-conductor layer and the base-metal layer to form a laminate. The plurality of read traces 130 and the plurality of write traces 120 can be formed of the layer of signal-conductor layer. Although copper alloy is specified herein, it should be understood that any material having high electrical conductivity, from which write traces 120 and read traces 130 can be formed, may be substituted for the copper alloy. The dielectric layer can be any dielectric that would be appropriate for insulating the read and write traces from the supporting base-metal layer.

Figure 8:
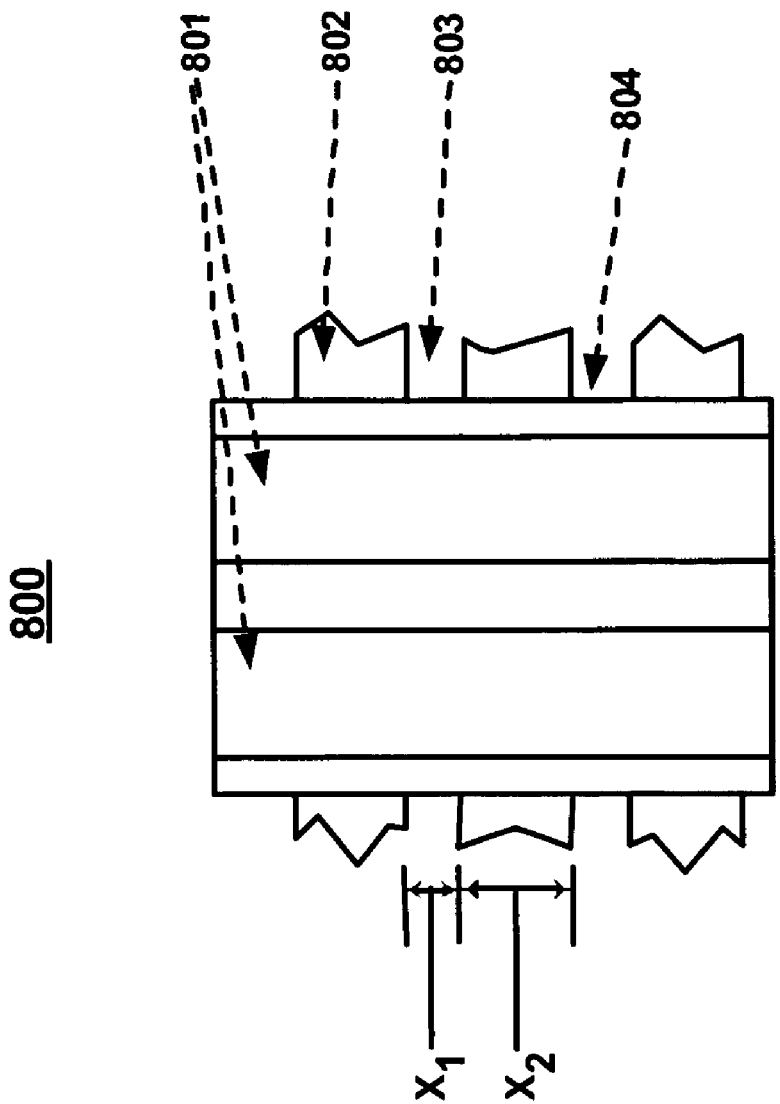
FIG. 8 is a top view of signal traces over a section of the dual serpentine base metal layer separated by a dielectric layer, in accordance with one embodiment of the present invention.

Still referring to FIG. 4, the dual serpentine patterns 410a and 410b are formed of the base-metal layer, according to one embodiment. This layer may be stainless steel, or it may be any base metal that would have the appropriate mechanical stiffness, electrical characteristics and manufacturability needed. Refer to FIG. 8 for further details of the electrical characteristics.

According to one embodiment of the present invention, the mechanical stiffness of flexing interconnect 300, and portion 400 thereof of FIG. 4, is also affected by the period and the geometry of the serpentine patterns 410a and 410b. The geometries of at least one pattern 410a or 410b of dual serpentine patterns 410a and 410b are alterable to achieve a predefined mechanical stiffness. A compromise may be reached to achieve both an acceptable mechanical stiffness and characteristic impedance for signal traces.

Figure 5:
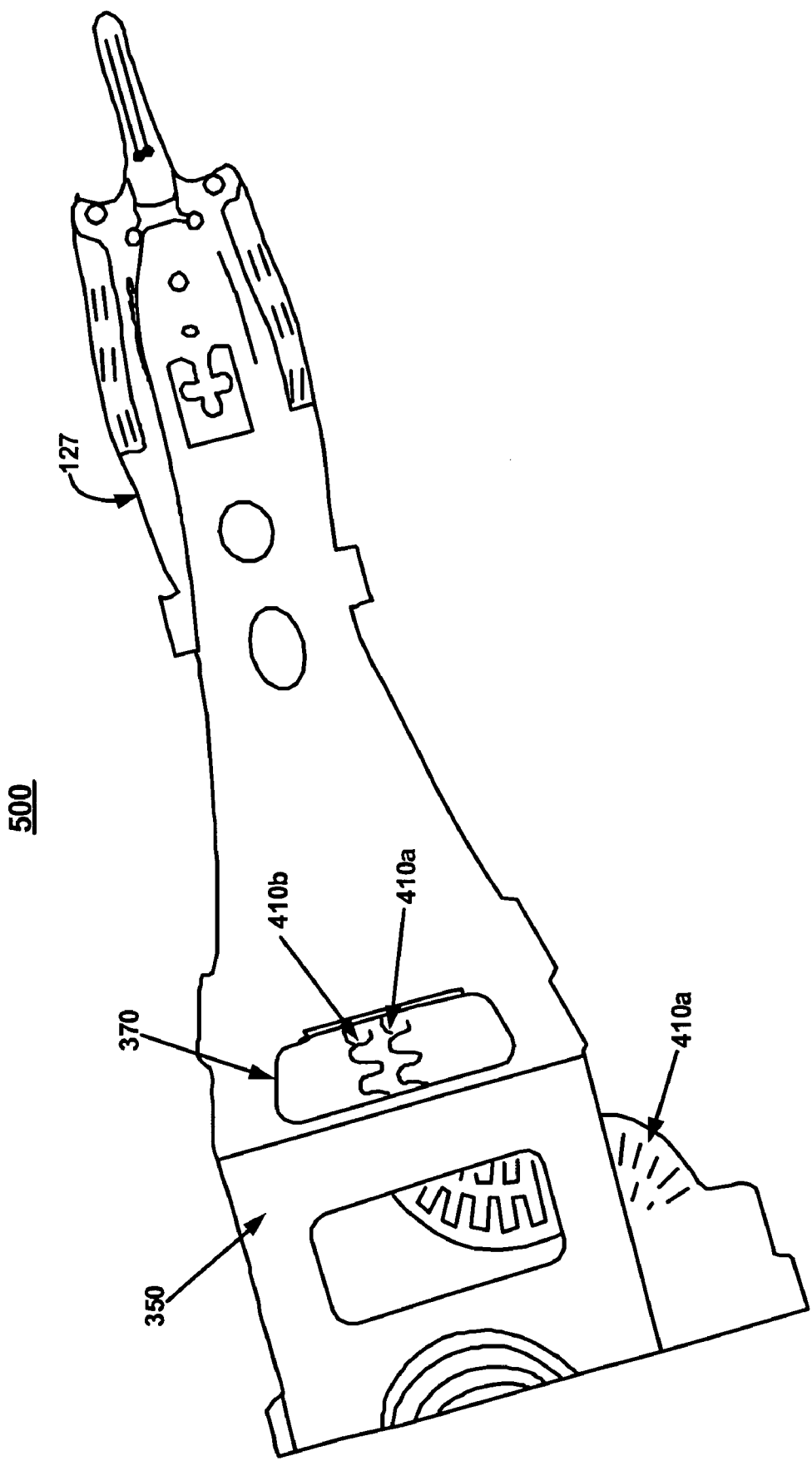
FIG. 5 is a bottom plan view of an ELS showing a dual serpentine pattern support as it traverses the hinge area of an ELS, in accordance with an embodiment of the present invention.

FIG. 5 is a bottom plan view 500 of an ELS 127 showing dual serpentine pattern supports 410a and 410b as they traverse the center of hinge area 370 and onto hinge plate 350 of ELS 127, in accordance with an embodiment of the present invention.

Figure 6:
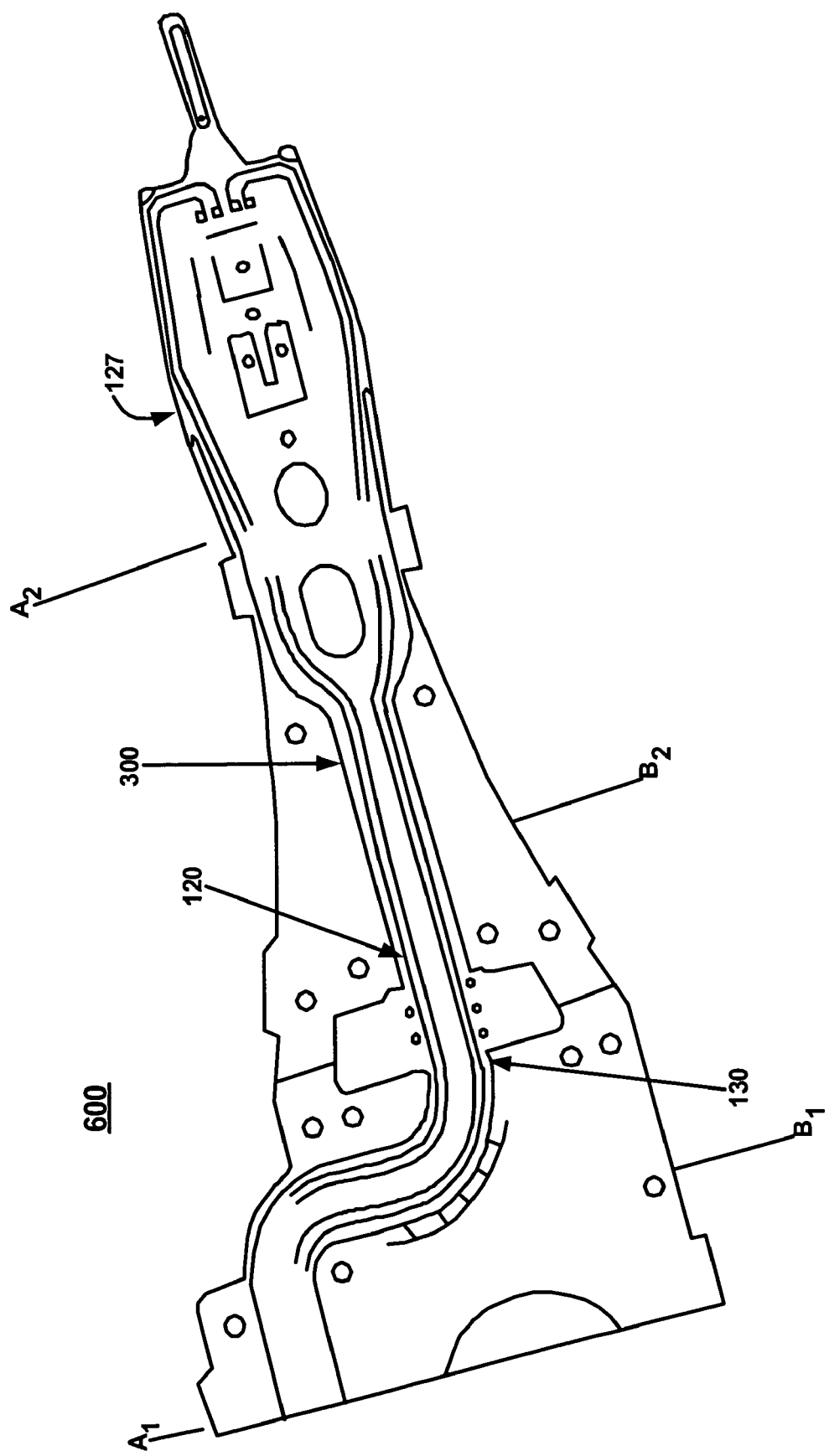
FIG. 6 is a top plan view of an ELS showing read and write traces that are supported by a dual serpentine pattern in at least the hinge area of the ELS, in accordance with an embodiment of the present invention.

FIG. 6 is a top plan view of an ELS 127 showing flexing interconnect 300 with read traces 130 and write traces 120, that have a base-metal layer with dual serpentine patterns 410a and 410b of FIG. 5, in at least the hinge area $B_1$-$B_2$ of the ILS 127, in accordance with an embodiment of the present invention. In another embodiment, write traces 120 and read traces 130 may be supported by dual serpentine patterns 410a and 410b anywhere along the flexing interconnect 300 of ELS 127, e.g., $A_1$-$A_2$.

FIG. 7 is a flow diagram of a method 700 for obtaining low crosstalk and signal loss in a flexing interconnect (e.g. flexing interconnect 300 of FIG. 3), in accordance with one embodiment of the present invention. At step 710 of method 700, a laminate is provided in the flexing interconnect for an ELS (e.g., ELS 127 of FIG. 2). The laminate, according to one embodiment, has at least a signal-conductor layer, a dielectric layer and a base-metal layer. The dielectric layer resides between the signal-conductor layer and the base-metal layer.

At step 720 of method 700, according to an embodiment of the present invention, a plurality of read traces, e.g., read traces 130 of FIG. 4, are supported above a first serpentine pattern of dual serpentine patterns above at least a hinged area of an ILS, the first serpentine pattern being formed of the base-metal layer of the laminate in accordance with defined air gap to base metal dimension ratio, K. The plurality of read traces are, according to one embodiment, formed of a signal-conductor layer.

At step 730, according to an embodiment of the present invention, a plurality of write traces, e.g., write traces 120 of FIG. 4, are supported above a second serpentine pattern of the dual serpentine patterns above said at least the hinged area of the ELS. The second serpentine pattern is formed of the base-metal layer of the laminate in accordance with defined air gap to base metal dimension ratio, K. The plurality of write traces are, according to one embodiment, formed of a signal-conductor layer. The second serpentine pattern is separated from the first serpentine pattern, thus separating the plurality of read traces from the plurality of write traces. The separated nature of the plurality of write traces and the plurality of read traces reduces write-to-read crosstalk.

FIG. 8 is a top view 800 of signal traces 801 (e.g. read or write traces), in accordance with an embodiment of the present invention, where x1 is the periodic width of the air gaps 803 and 804, and x2 is the periodic width of the base-metal layer 802. The ratio, K=x1/x2, affects characteristic impedance (Zo) of a signal trace. The characteristic impedance of the signal traces is determined by the ratio K, the signal trace widths, and the cross-section dimensions of the laminate layers. Therefore, the required characteristic impedance can be achieved by proper design of K, signal trace width(s), and the cross-section geometry. The period dimension, P=x1+x2, in FIG. 8 can be designed to be low with respect to the electrical signals' wavelength. Also, the period P may be constant or may vary along the signal traces' path to accommodate special electrical signal shaping.

Figure 9:
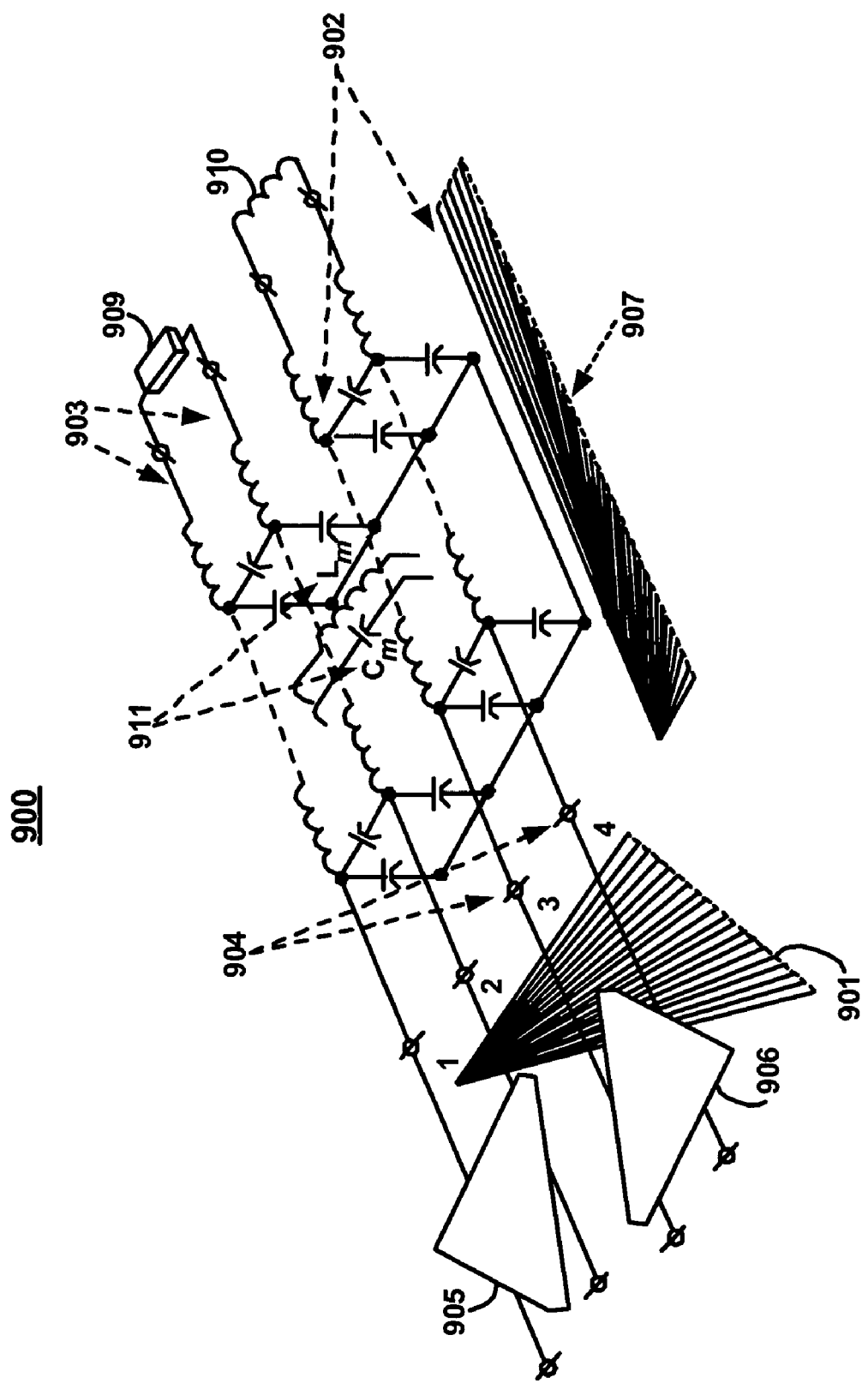
FIGS. 9 is a physical-electrical schematic of the ELS with the read and write electrical connections, in accordance with one embodiment of the present invention.

FIG. 9 is a physical-electrical schematic 900 of the read and write traces 901 (read 1, 2 and write 3, 4) over the dual serpentine base metal 902, in accordance with an embodiment of the present invention. The crosstalk source is the write driver, 906, and the write signals propagate to the write element 910 through the ELS 907. The read amplifier, 905, receives the signal from the read element 909. Here, the crosstalk injection voltage (Vw) is measured across at 904, and far-end crosstalk voltage (Vr) is measured across at 903. The relative crosstalk level, Vct, is in dB units, where Vct=20*$\log_{10}$(Vr/Vw). The physical separation of the dual serpentine, for the read and write traces, reduces the mutual couple terms 911 ($C_m$ and $L_m$).

Figure 10:
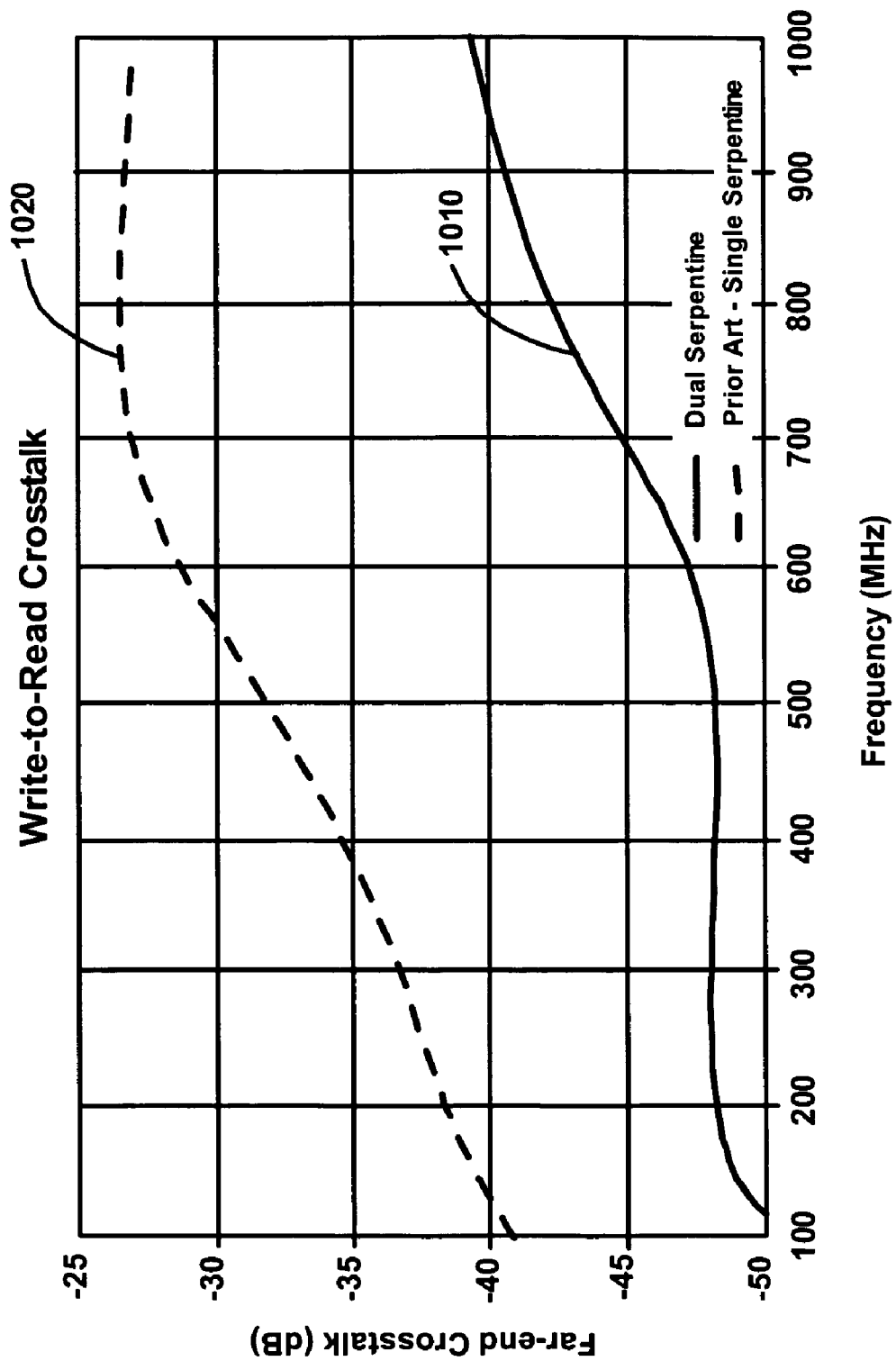
FIG. 10 is a graphical representation of the crosstalk improvement from the prior art single serpentine designs, in accordance with one embodiment of the present invention.

FIG. 10 is a graphical representation of the crosstalk improvement from the prior art single serpentine designs, according to one embodiment. Dotted line 1020 represents the read-to-write crosstalk in dB in the prior art as a function of frequency and solid line 1010 represents the read-to-write crosstalk in dB in the present embodiment of a dual serpentine ELS 907 as a function of the same frequencies. Additionally, the alternating air gap and base metal, for the required characteristic impedance, reduces the signal loss through the ELS 907 with a lossy (low conductive) base-metal layer.

Figure 11:
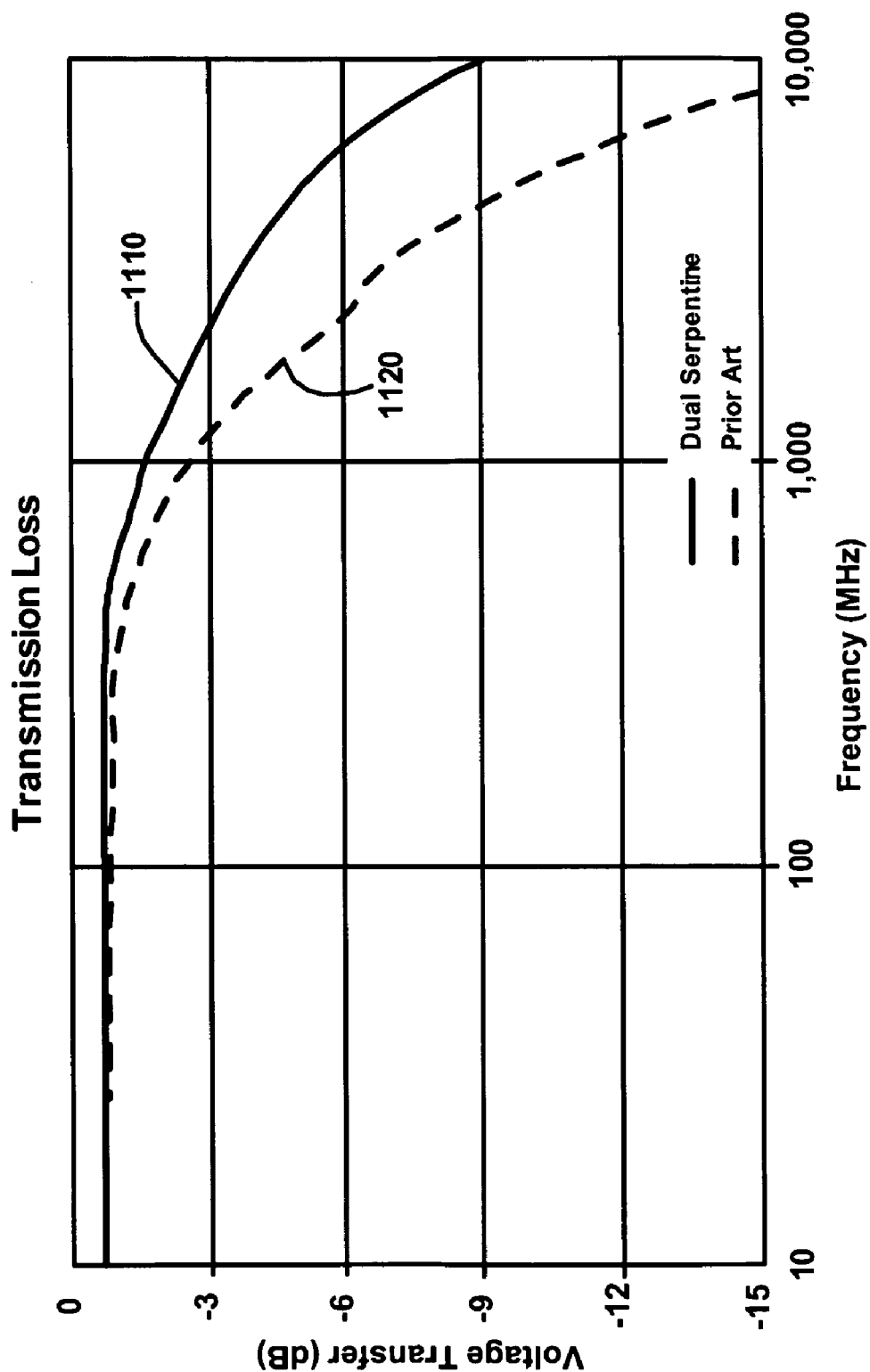
FIG. 11 is a graphical representation of voltage transfer differences between the dual serpentine ELS of the present embodiment and an ELS with no air gaps, in accordance with one embodiment of the present invention.

FIG. 11 is a graphical representation of voltage transfer differences between the dual serpentine ELS of the present embodiment and an ELS with no air gaps (x1=0 in FIG. 8) as in the prior art. Solid line 1110 represents the voltage transfer loss in dB in the dual serpentine ELS as a function of frequency and the dotted line 1120 represents the voltage transfer loss in the prior art. Also, by altering the geometry of at least one of the dual serpentine patterns, a predefined mechanical stiffness can be achieved.

Thus, the present invention provides, in various embodiments, a method and apparatus reducing crosstalk and signal loss in flexing interconnects in an ELS. Although embodiments of the present invention are described in the context of an ELS in an information storage system, it should be understood that embodiments may apply to any device utilizing an electrical interconnect that might experience signal loss and crosstalk between signal traces. For example, embodiments of the present invention may apply to rigid printed circuit boards. More specifically, embodiments of the present invention may be used in printed circuit boards that are used for high speed signal processing. Embodiments of the present invention are also suitable for use in flexing circuits, e.g., flexing circuits for digital cameras and digital camcorders. According to one embodiment, the signal traces may be replaced with power traces.

The foregoing descriptions of specific embodiments have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An electrical interconnect comprising:
    a laminate;
    a plurality of signal traces in a first formed layer of said laminate;
    a subsequent plurality of traces in said first formed layer of said laminate, wherein said subsequent plurality of traces is selected from the group consisting essentially of signal traces and power traces;
    a dielectric layer of said laminate; and
    a plurality of serpentine patterns in a second formed layer of said laminate, said plurality of serpentine patterns separated from a subsequent plurality of patterns, said plurality of serpentine patterns supporting said dielectric layer supporting said plurality of signal traces and said subsequent plurality of patterns supporting said dielectric layer supporting said subsequent plurality of traces, wherein said supporting said subsequent plurality of traces separate from said plurality of signal traces reduces signal loss and crosstalk between said plurality of signal traces and said subsequent plurality of traces.

2. The electrical interconnect as described in claim 1, wherein said subsequent plurality of patterns are serpentine patterns.

3. The electrical interconnect as described in claim 2, wherein said electrical interconnect is used for an electrical lead suspension, said electrical lead suspension further comprising:
    a plurality of read traces in said first formed layer of said laminate;
    a plurality of write traces in said first formed layer of said laminate; and
    dual serpentine patterns in said second formed layer of said laminate, a first of said dual serpentine patterns separated from a second of said dual serpentine patterns, said first of said dual serpentine patterns supporting said dielectric layer supporting said plurality of read traces and said second of said dual serpentine patterns supporting said dielectric layer supporting said plurality of write traces residing at least in a hinge area of said integrated lead suspension, wherein said supporting said plurality of write traces separate from said plurality of read traces reduces write-to-read crosstalk and signal loss.

4. The flexing interconnect as described in claim 3, wherein said laminate comprises at least a signal-conductor layer, a dielectric layer and a base-metal layer.

5. The flexing interconnect as described in claim 4, wherein said plurality of read traces and said plurality of write traces are formed of said signal-conductor layer.

6. The flexing interconnect as described in claim 4, wherein said second formed layer of said laminate of which said dual serpentine patterns are formed comprises said base metal.

7. The flexing interconnect as described in claim 4, wherein the thickness of said dielectric layer is variable for producing a predefined electrical characteristic impedance.

8. The flexing interconnect as described in claim 4, wherein the thickness of said dielectric layer is variable for producing a predefined mechanical stiffness.

9. The flexing interconnect as described in claim 6, wherein said base-metal layer is stainless steel.

10. The flexing interconnect as described in claim 8, wherein a ratio of air gap to stainless steel in at least one of said dual serpentine patterns is dynamically alterable to produce a predefined characteristic impedance.

11. The flexing interconnect as described in claim 3, wherein the geometry of said at least one pattern of said dual serpentine patterns is dynamically alterable to achieve a predefined mechanical stiffness.

12. A method for obtaining low crosstalk and signal loss in a flexing interconnect, said method comprising:
    providing a laminate;
    supporting a plurality of read traces above a first serpentine pattern of dual serpentine patterns above at least a hinged area of an electrical lead suspension, said first serpentine pattern formed of said laminate; and
    supporting a plurality of write traces above a second serpentine pattern of said dual serpentine patterns above said at least said hinged area of said electrical lead suspension, said second serpentine pattern formed of a base metal layer of said laminate, wherein said second serpentine pattern is separated from said first serpentine pattern, and wherein said separated nature and said serpentine pattern of said base-metal layer under said plurality of write traces and said plurality of read traces reduces write-to-read crosstalk and signal loss.

13. The method as recited in claim 12, wherein said step of providing a laminate further comprises providing, in said laminate, at least three layers: a signal-conductor layer, a dielectric layer and a base-metal layer.

14. The method as recited in claim 12, wherein said providing a laminate further comprises said plurality of read traces and said plurality of write traces being formed of said signal-conductor layer.

15. The method as recited in claim 12, wherein said providing a laminate further comprises said dual serpentine patterns being formed of said base-metal layer.

16. The method as recited in claim 12, wherein said providing a laminate further comprises achieving a predefined characteristic impedance by providing a corresponding thickness of said layer of dielectric layer.

17. The method as recited in claim 12, wherein said providing a laminate further comprises achieving a predefined characteristic impedance by providing a corresponding signal trace width(s) formed of said signal-conductor layer.

18. The method as recited in claim 12, further comprising producing a predefined characteristic impedance by altering a ratio of air gap to base metal in at least one of said dual serpentine patterns.

19. The method as recited in claim 12, further comprising achieving a predefined mechanical stiffness by altering the geometry of at least one of said dual serpentine patterns.

20. A hard disk drive comprising:
    a housing;
    a disk pack mounted to the housing and having a plurality of disks that are rotatable relative to the housing, the disk pack defining an axis of rotation and a radial direction relative to the axis, and the disk pack having a downstream side wherein air flows away from the disks, and an upstream side wherein air flows toward the disk;

an actuator mounted to the housing and being movable relative to the disk pack, the actuator having a plurality of heads for reading data from and writing data to the disks; and a flexing interconnect of an electrical lead suspension, said electrical lead suspension coupled to said actuator, and said flexing interconnect comprising:

a laminate;

a plurality of read traces formed of said laminate;

a plurality of write traces formed of said laminate; and dual serpentine patterns formed of a layer of said laminate, a first of said dual serpentine patterns separated from a second of said dual serpentine patterns, said first of said dual serpentine patterns supporting said plurality of read traces and said second of said dual serpentine patterns supporting said plurality of write traces above at least a hinge area of said electrical lead suspension, wherein said supporting said plurality of write traces separate from said plurality of read traces reduces write-to-read crosstalk and signal loss.

21. The hard disk drive as described in claim 20, wherein said laminate is comprised of at least three layers: signal-conductor layer, a dielectric layer and a base-metal layer.

22. The hard disk drive as described in claim 20, wherein said plurality of read traces and said plurality of write traces are formed of said signal-conductor layer.

23. The hard disk drive as described in claim 20, wherein said layer of said laminate of which said dual serpentine patterns are formed comprises said base-metal layer.

24. The hard disk drive as described in claim 20, wherein a ratio of air gap to base metal in at least one of said dual serpentine patterns is dynamically alterable to produce a predefined characteristic impedance.

25. The hard disk drive as described in claim 20, wherein at least one pattern of said dual serpentine patterns is dynamically alterable to achieve a predefined mechanical stiffness.

26. A flexing interconnect in an electrical lead suspension comprising:

laminate means for providing support to attached devices;

a plurality of read traces means in a formed layer of said laminate for transmitting read signals;

a plurality of write traces means in a formed layer of said laminate for transmitting write signals; and dual serpentine pattern means in a formed layer of said laminate, a first of said dual serpentine patterns separated from a second of said dual serpentine patterns, said first of said dual serpentine pattern means for supporting said plurality of read traces means and said second of said dual serpentine pattern means for supporting said plurality of write traces means above at least a hinge area of said electrical lead suspension, wherein said supporting said plurality of write traces means separate from said plurality of read traces means reduces write-to-read crosstalk and signal loss.

* * * * *